(12) United States Patent
Jeong

(10) Patent No.: US 8,099,842 B2
(45) Date of Patent: Jan. 24, 2012

(54) METHOD OF MANUFACTURING A PIEZOELECTRIC TRANSISTOR

(75) Inventor: Eun-Soo Jeong, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 60 days.

(21) Appl. No.: 12/553,985

(22) Filed: Sep. 4, 2009

(65) Prior Publication Data

US 2010/0060104 A1 Mar. 11, 2010

(30) Foreign Application Priority Data

Sep. 11, 2008 (KR) .................. 10-2008-0089587

(51) Int. Cl.
*H01L 41/053* (2006.01)
*H04R 17/10* (2006.01)

(52) U.S. Cl. .......... 29/25.35; 29/846; 257/415; 310/351

(58) Field of Classification Search .................. 29/25.35, 29/846, 852; 438/50, 51; 257/415, 420; 310/330, 351, 352, 353, 321
See application file for complete search history.

(56) References Cited

U.S. PATENT DOCUMENTS

| 4,570,139 | A | 2/1986 | Kroll | |
|---|---|---|---|---|
| 7,022,540 | B2 * | 4/2006 | Kim et al. | 438/50 |
| 7,053,456 | B2 * | 5/2006 | Matsuo | 257/415 |
| 7,545,246 | B2 | 6/2009 | Kim et al. | |
| 7,728,703 | B2 | 6/2010 | Kim et al. | |

FOREIGN PATENT DOCUMENTS

| JP | 60211986 A * | 10/1985 | ........... 257/415 |
|---|---|---|---|
| KR | 10-2007-0053515 | 5/2007 | |
| KR | 10-2007-0097963 | 5/2007 | |

* cited by examiner

*Primary Examiner* — A. Dexter Tugbang
(74) *Attorney, Agent, or Firm* — Sherr & Vaughn, PLLC

(57) ABSTRACT

According to the present application, a method of manufacturing a piezoelectric transistor may include forming a cavity over a substrate, such as a semiconductor substrate. The method may include depositing and patterning metal material over a portion of a cavity, and may include depositing an oxide film over a cavity and/or patterned metal material. Piezoelectric material may be deposited over an oxide film and patterned to avoid connection with metal material. The method may include depositing a second oxide film over a substrate including piezoelectric material. Metal wiring may be formed and may apply voltage to piezoelectric material that may be in contact with a semiconductor substrate.

9 Claims, 4 Drawing Sheets

METHOD OF MANUFACTURING A PIEZOELECTRIC TRANSISTOR

Figure 1:
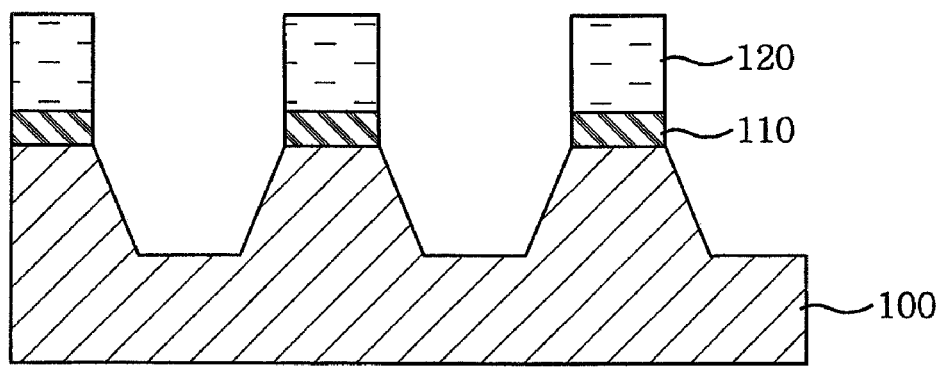

The present application claims priority under 35 U.S.C. 119 to Korean Patent Application No. 10-2008-0089587 (filed on Sep. 11, 2008), which is hereby incorporated by reference in its entirety.

BACKGROUND

Embodiments relate to electrical devices and methods of manufacturing the same. Some embodiments relate to a piezoelectric transistor and a method of manufacturing the same using a piezoelectric material.

A MOSFET (Metal Oxide Semiconductor Field Effect Transistor) structure may be relatively complex. A MOSFET may include a silicon substrate in which a source area and a drain area are formed on opposing sides of a surface of the silicon substrate, such that the source area supplies electrical charge and the drain area leads the electrical charge out. A MOSFET may include a gate oxide film formed over a channel forming area between source and drain areas, and may also include a gate electrode. A MOSFET may be classified as a N-channel MOSFET, and may include a silicon substrate having P-type semiconductor material with source and drain areas having N-type semiconductor material. A MOSFET may also be classified as a P-channel MOSFET, and may include a silicon substrate having N-type semiconductor material with source and drain areas having P-type semiconductor material. Accordingly, a N-channel MOSFET may include a P-type silicon substrate in which N-type source and drain areas are formed on opposing sides of the surface thereof, a gate oxide film formed over a channel forming area between N-type source and drain areas, and a gate electrode.

A channel may be formed for a MOSFET, such as a N-channel MOSFET described above. A P-type silicon substrate may have a gate oxide film between the silicon substrate and a gate electrode. A channel may be formed in a channel forming area by applying substantially constant-voltage to a gate electrode that is relatively larger compared to a threshold voltage. The source area and the drain area may then be connected electrically, such that when a drain voltage is applied to the source and drain areas, current may flow between the areas enabling operations to be executed, including turn-on and/or turn-off operations.

Forming a MOSFET may include many processes, for example to form a source, drain and/or gate. Fabricating a N-channel MOSFET may include forming an oxide film to insulate a gate electrode on a P-type silicon substrate. The fabrication process may also include depositing a polycrystalline silicon layer to from a gate electrode. Fabricating a N-channel MOSFET may include patterning the polycrystalline silicon layer and the oxide film by photolithography to form a gate oxide film and a gate electrode. The fabrication process may also include forming a buffer oxide film and forming N-type source and drain areas by injecting impurity ions. Therefore, there is a need for electrical devices and methods of manufacturing the same that are relatively less complex while relatively reliable, cost effective, easy to operate, and/or scalable.

SUMMARY

Embodiments relate to a piezoelectric transistor including piezoelectric material. According to embodiments, piezoelectric material may be deposited in cantilever form. In embodiments, piezoelectric material may be used as a switch to form a piezoelectric transistor.

According to embodiments, a piezoelectric transistor may include a substrate such as a semiconductor substrate. In embodiments, the substrate may include a cavity. The cavity may be etched downward. In embodiments, piezoelectric material may be formed over a semiconductor substrate in a cantilever form and may be elastically strained up and/or down. Metal material may be electrically connected to piezoelectric material by the piezoelectric effect and metal wiring may supply voltage to piezoelectric material in accordance with embodiments.

Embodiments relate to a method of manufacturing a piezoelectric transistor. According to embodiments, a method of manufacturing a piezoelectric transistor may include forming a cavity over a substrate, such as a semiconductor substrate. Embodiments may include depositing and patterning metal material over a portion of a cavity, and may include depositing an oxide film over a cavity and/or patterned metal material. According to embodiments, piezoelectric material may be deposited over an oxide film and patterned to avoid connection with metal material. Embodiments may include depositing a second oxide film over a substrate including piezoelectric material. In embodiments, metal wiring may be formed and may apply voltage to piezoelectric material that may be in contact with a semiconductor substrate. In embodiments, the oxide film may be a relatively low temperature oxide film.

According to embodiments, a method of manufacturing a piezoelectric transistor may eliminate a pattern forming process used to mask and an impurity injecting process used to form a channel, source area, and/or drain area.

DRAWINGS

Example FIG. 1 to FIG. 9 illustrate a process of manufacturing a piezoelectric transistor, according to embodiments.

Figure 10:
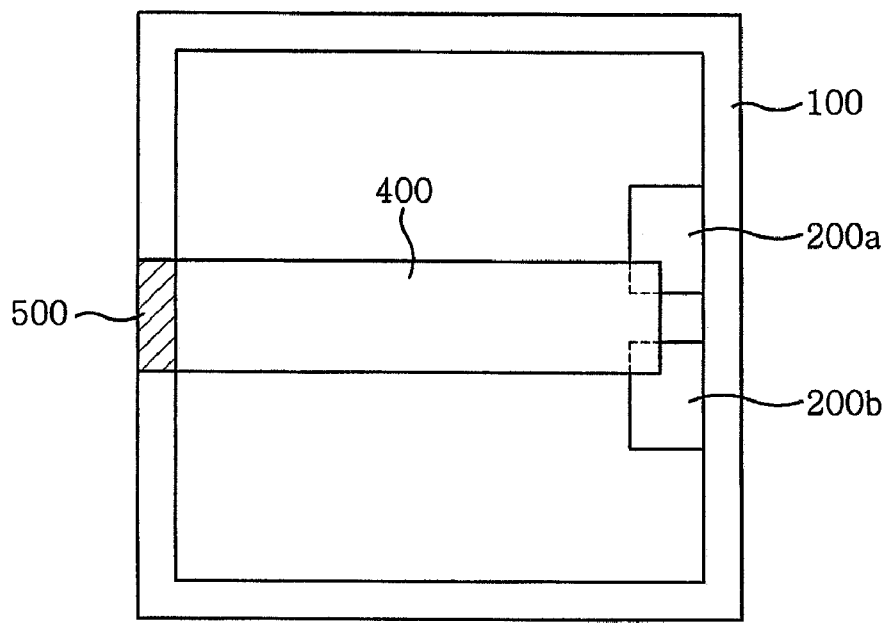

Example FIG. 10 illustrates a piezoelectric transistor manufactured according to embodiments.

Figure 11:
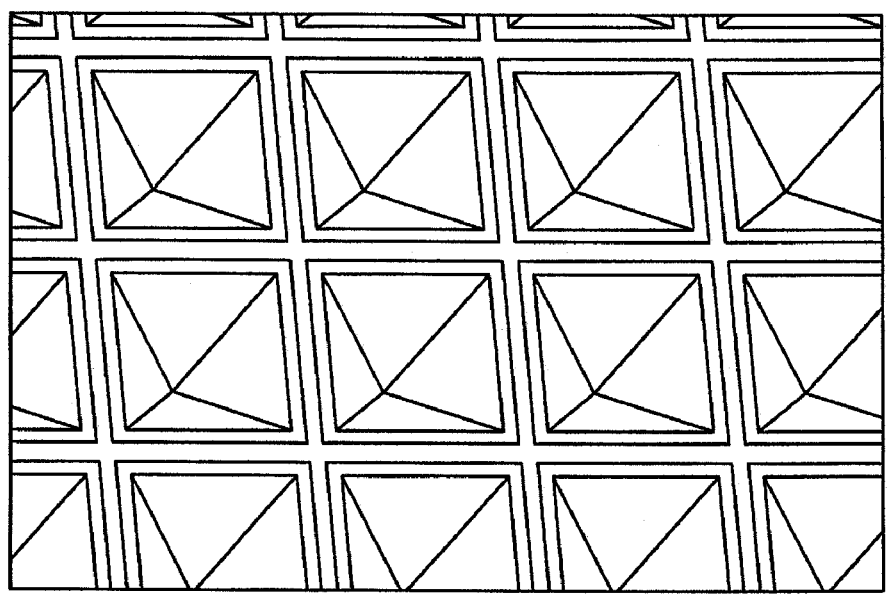

Example FIG. 11 illustrates a substrate having a quadrangular pyramid form in which single crystalline substrate is wet etched with crystalline orientation of [100], according to embodiments.

DESCRIPTION

In embodiments, the piezoelectric effect may relate to a phenomenon whereby mechanical strain is generated in a substantially constant direction when an electric field is applied to a certain material (e.g., a crystalline).

Embodiments relate to a piezoelectric transistor configured to use the piezoelectric effect. According to embodiments, piezoelectric material 400 may be deposited in cantilever form over a substrate, such as semiconductor substrate 100, as shown in example FIG. 9. Metal wiring 500 may be connected to piezoelectric material 400 and may supply voltage to piezoelectric material 400. According to embodiments, when voltage is applied to piezoelectric material 400 through metal wiring 500, piezoelectric material 400 may generate mechanical strain by the piezoelectric effect. In embodiments, piezoelectric material 400 may generate a mechanical strain substantially downward by the piezoelectric effect.

Figure 9:
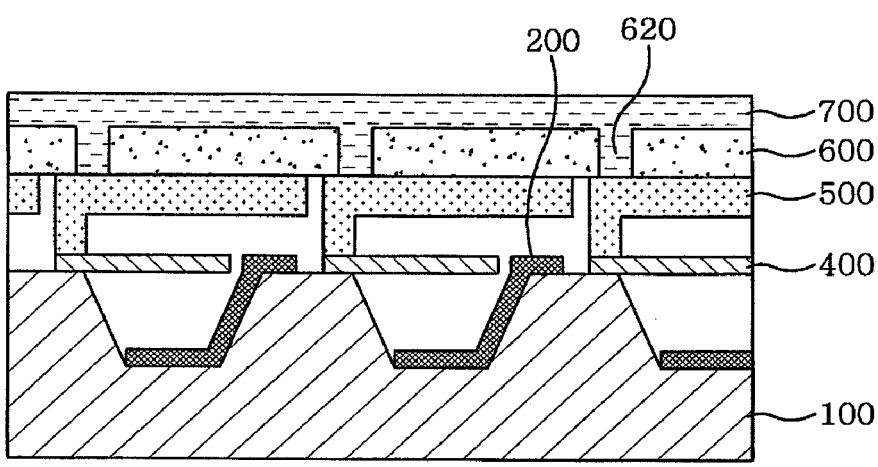

As shown in FIG. 9, metal material 200 may be deposited over semiconductor substrate 100 such that when piezoelectric material 400 contacts metal material 200, current may flow through metal material 200. According to embodiments, metal material 200 may maintain a substantially electrical conductive state. In embodiments, mechanical strain exerted by the piezoelectric effect may enable piezoelectric material 400 to contact metal material 200 by controlling a threshold voltage applied to piezoelectric material 400. According to embodiments, when voltage applied to piezoelectric material is substantially removed, piezoelectric material may be substantially returned to an initial state. In embodiments, substantially no current may flow, for example through metal material 200, when voltage applied to piezoelectric material 400 is substantially removed. In embodiments, metal material such as metal material 200 may maintain a substantially electrical off-state. According to embodiments, piezoelectric material may include PZT (lead zirconate titanate) and/or Barium titanate.

Referring to example FIG. 10, embodiments relate to a piezoelectric transistor configured to use the piezoelectric effect. According to embodiments, a piezoelectric transistor may include metal materials 200a and 200b. In embodiments, metal materials 200a and 200b may each serve as an electric contact, and a voltage may be supplied to piezoelectric material 400 to provide an electrical connection. In embodiments, a mechanical strain may be applied substantially downward and piezoelectric material 400 may contact metal materials 200a and 200b to fix contacts by the piezoelectric effect. Accordingly, in embodiments, current may flow between contacts by enabling connections of contacts. In embodiments, piezoelectric material 400 may be substantially returned to an initial state when voltage is substantially eliminated, and metal materials 200a and 200b may be substantially electrically isolated. Accordingly, the functions associated with transistors can be substantially realized by using mechanical strain derived from piezoelectric materials.

Embodiments relate to a method of manufacturing a piezoelectric transistor configured to use the piezoelectric effect. A voltage may be applied to piezoelectric material, such as piezoelectric material 400, to insure a space sufficient for elastic strain downward by mechanical strain. As shown in example FIG. 1 oxide film, such as oxide film 110, may be used as a hard mask and may be deposited over a substrate, such as semiconductor substrate 100. According to embodiments, semiconductor substrate 100 may be of a single crystalline silicon. In embodiments, a first photo resist 120 may be applied over oxide film 110 and may be patterned using a photolithography and/or an etching process.

According to embodiments, etching including reactive ion etching (RIE) for anisotropic etching and/or wet etching may be executed over a patterned oxide film over semiconductor substrate 100 to form a cavity. In embodiments, a cavity may include a quadrangular pyramid form in semiconductor substrate 100. Example FIG. 11 illustrates a substrate, such as a silicon wafer, having a cavity in a form of a quadrangular pyramid in single crystalline silicon which may be formed by a wet etching process in [100] crystalline orientation.

Figure 2:
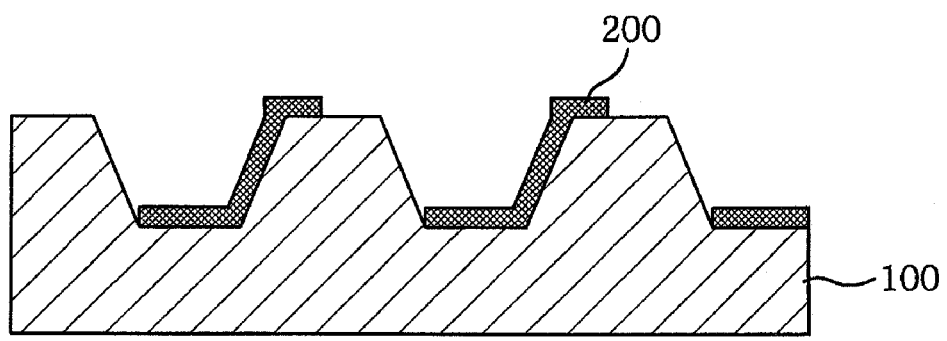
Figure 3:
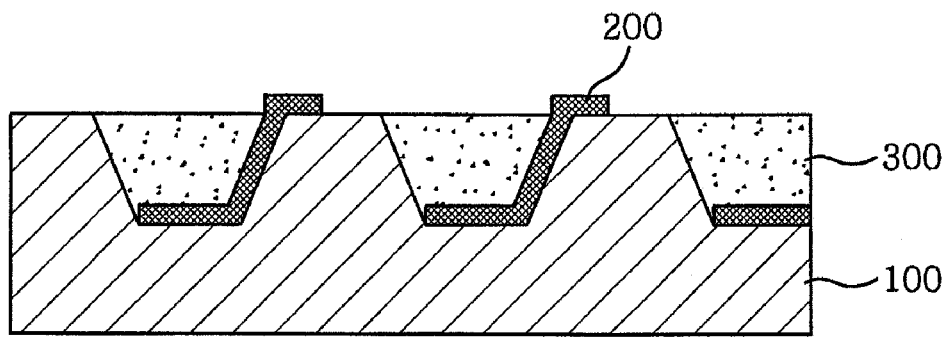

Referring to example FIG. 2, a metal material such as metal material 200 may be deposited over substrate 100 having a cavity which may be of quadrangular pyramid form. According to embodiments, metal material 200 may be formed as shown in FIG. 2. In embodiments, the form of metal material 200 may be controlled by using photolithographic and/or etching processes. Referring to example FIG. 3, deposition of piezoelectric material 400 may include a relatively low temperature oxide film, such as low temperature oxide film 300 which may be used as a sacrificial layer. According to embodiments, oxide film 300 may be deposited and be planarized by, for example, a Chemical Mechanical Polishing process (CMP).

Figure 4:
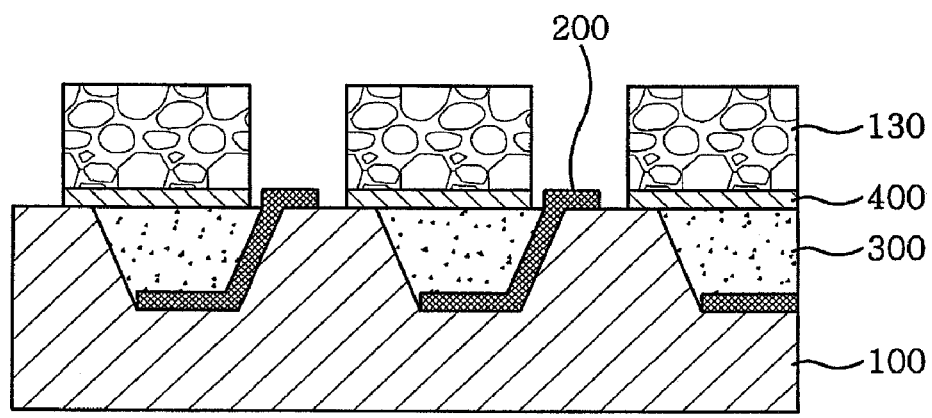

Referring to example FIG. 4, piezoelectric material 400 may be deposited over low temperature oxide film 300 and semiconductor substrate 100. According to embodiments, second photo resist 130 may be applied thereon, and the resultant structure may be patterned through a photolithograph and/or an etching process to avoid connecting metal material 200 and piezoelectric 400, and to form a patterned piezoelectric material. In embodiments, photolithograph and/or etching processes may enable only one end of piezoelectric material 400 to contact semiconductor substrate 100. In embodiments, elastic deformation of piezoelectric material 400 substantially downward by the piezoelectric effect may be enhanced by manufacturing piezoelectric material 400 into a cantilever form.

Figure 5:
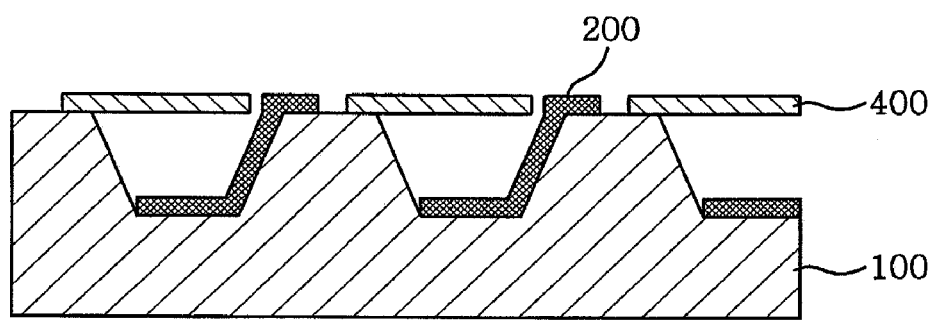
Figure 6:
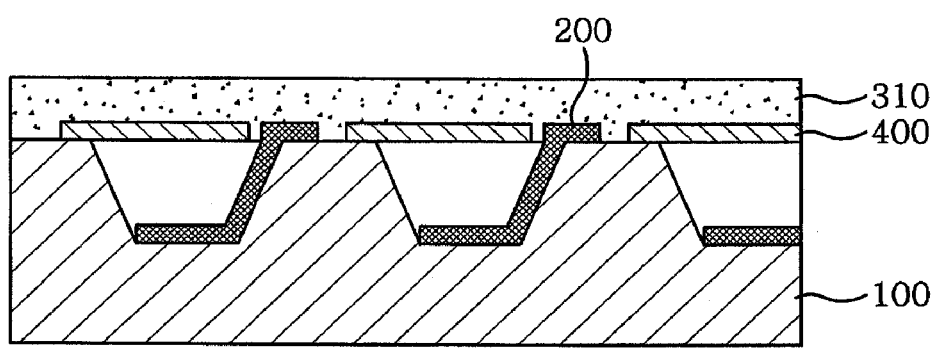

Referring to example FIG. 5, second photo resist 130 and low temperature oxide film 300 may be substantially eliminated. As shown in example FIG. 6, low temperature oxide film 310 may be deposited over patterned piezoelectric material 400 and semiconductor substrate 100.

Figure 7:
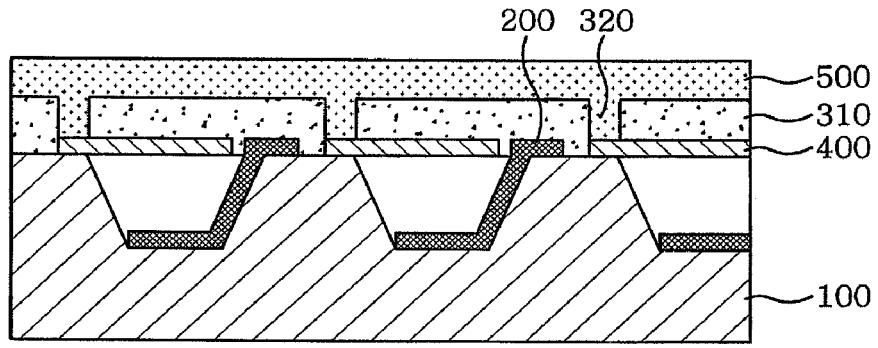

Referring to example FIG. 7, via 320 may be formed through a photolithograph and/or an etching process over low temperature oxide film 310, and a metal may be deposited over via 320 and low temperature oxide film 310 to form first metal wiring 500. According to embodiments, via 320 may be formed over a portion where the end of piezoelectric material 400 contacts semiconductor substrate 100. In embodiments, metal may be deposited over via 320 and contact piezoelectric material 400. Metal disposed in via 320 may be used to apply voltage to generate the piezoelectric effect. In embodiments, metal may include aluminum.

Figure 8:
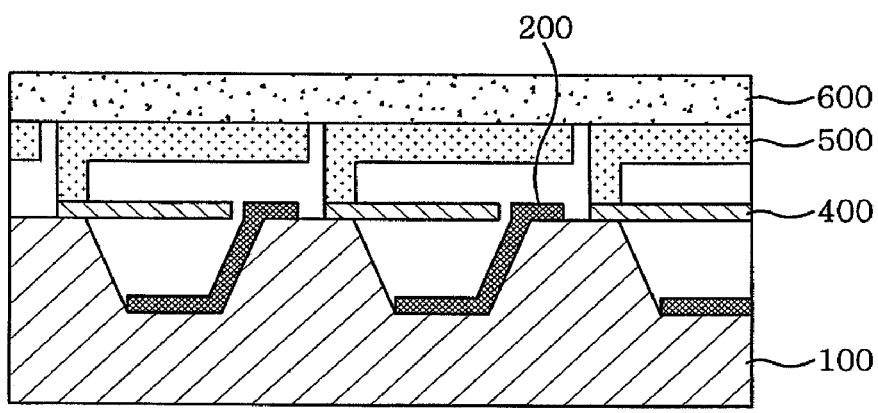

Referring to example FIG. 8, first metal connection 500 may be patterned and low temperature oxide film 130 may be substantially eliminated. In embodiments, a Inter Metal Dielectric (IMD) layer may be deposited to provide insulation from a second metal wiring. According to embodiments, IMD layer 600 may include Tetra-ethyl ortho-silicate (TEOS) film. Referring to FIG. 9, via 620 may be formed over IMD layer 600, and metal may be deposited over via 620 and/or IMD layer 600 to form the second metal connection 700.

While embodiments relate to manufacturing of a transistor including piezoelectric material, wherein piezoelectric material may be in a cantilever form in which one end of the piezoelectric material may be fixed and the other end is not, and wherein the transistor may execute switching operations, various changes and/or modifications can be made. For example, changes and/or modification can be made to forming first and second metal wirings to apply voltage on piezoelectric material in the cantilever form.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a cavity over a substrate;
   depositing a metal material over at least a portion of the cavity;
   depositing a piezoelectric material disconnected from the metal material; and
   forming a metal wiring configured to apply voltage to the piezoelectric material,
   wherein the piezoelectric material moves downward and contacts the metal material by a piezoelectric effect.

2. The method of claim 1, wherein the substrate comprises semiconductor material.

3. The method of claim 1, comprising:
wherein depositing the metal material includes:
   patterning the metal material; and
   depositing a first oxide film over the cavity and the patterned metal material, and
wherein depositing the piezoelectric material includes:
   depositing the piezoelectric material over the first oxide film;
   patterning the piezoelectric material; and
   depositing a second oxide film over the substrate.

4. The method of claim 3, wherein at least one of the first oxide film and the second oxide film comprises a relatively low temperature oxide film.

5. The method of claim 3, wherein the piezoelectric material is in contact with the substrate.

6. The method of claim 5, wherein forming the metal wiring comprises:
   forming a via over the second oxide film where the piezoelectric material is in contact with the substrate;
   depositing a metal over the via and the second oxide film to form a first metal wiring;
   patterning the first metal wiring;
   forming an inter metal dielectric layer over the patterned first metal wiring;
   forming a via over the inter metal dielectric layer; and
   depositing metal over the via and the inter metal dielectric layer to form a second metal wiring.

7. The method of claim 6, wherein the inter metal dielectric layer comprises Tetra-ethyl ortho-silicate.

8. The method of claim 1, wherein the cavity is formed by at least one of a reactive ion etching and a wet etching process.

9. The method of claim 1, wherein:
   the metal wiring comprises aluminum; and
   the piezoelectric material comprises at least one of lead zirconate titanate and barium titanate.

* * * * *